United States Patent
Li et al.

(10) Patent No.: US 10,990,520 B2
(45) Date of Patent: Apr. 27, 2021

(54) METHOD FOR GABAGE COLLECTING FOR NON-VOLATILE MEMORY

(71) Applicant: Storart Technology Co., Ltd., Hsinchu (TW)

(72) Inventors: Bing-En Li, Hsinchu (TW); Hou-Yun Lee, Hsinchu County (TW); Sei-Fer Wei, New Taipei (TW)

(73) Assignee: Storart Technology Co., Ltd., Hsinchu (TW)

( * ) Notice: Subject to any disclaimer, the term of this patent is extended or adjusted under 35 U.S.C. 154(b) by 205 days.

(21) Appl. No.: 16/214,649

(22) Filed: Dec. 10, 2018

(65) Prior Publication Data

US 2020/0183830 A1    Jun. 11, 2020

(51) Int. Cl.
| G06F 7/02 | (2006.01) |
| G06F 16/00 | (2019.01) |
| G06F 12/02 | (2006.01) |
| G06F 16/17 | (2019.01) |

(52) U.S. Cl.
CPC ...... *G06F 12/0253* (2013.01); *G06F 12/0246* (2013.01); *G06F 16/1727* (2019.01)

(58) Field of Classification Search
CPC ............. G06F 12/0253; G06F 12/0246; G06F 12/023; G06F 2212/702; G06F 2212/7205; G06F 3/0604; G06F 3/061; G06F 16/1727
See application file for complete search history.

(56) References Cited

U.S. PATENT DOCUMENTS

| 9,619,321 | B1* | 4/2017 | Haratsch | G06F 3/064 |
| 2014/0101372 | A1* | 4/2014 | Jung | G11C 16/26 |
| | | | | 711/103 |
| 2017/0317693 | A1* | 11/2017 | Yang | G11C 16/10 |
| 2019/0004964 | A1* | 1/2019 | Kanno | G06F 3/064 |
| 2019/0391914 | A1* | 12/2019 | Hsiao | G11C 16/34 |

OTHER PUBLICATIONS

Hruska, Joel, "New method of SSD garbage collection can boost drive performance up to 300%," published May 28, 2014 at extremetech.com. (Year: 2014).*

* cited by examiner

*Primary Examiner* — Bruce M Moser
(74) *Attorney, Agent, or Firm* — Demian K. Jackson; Jackson IPG PLLC

(57) ABSTRACT

A method for garbage collecting for non-volatile memories are disclosed. The method includes steps: a) providing a SSD, connected to a host, containing a plurality of TLC blocks and SLC blocks; b) reading 3M TLC pages in a TLC block having data; c) moving valid data in the TLC blocks to at least one clean TLC block; d) sending a host program command of 1 page to the host; e) repeating step b) to step d) until valid data in 8 TLC blocks are moved; f) reading 1 SLC page in a SLC block having data; g) moving valid data in the SLC block to the at least one clean TLC block; h) sending a host program command of α page to the host; and i) repeating step f) to step h) until valid data in the SLC block having data are moved.

6 Claims, 5 Drawing Sheets

METHOD FOR GABAGE COLLECTING FOR NON-VOLATILE MEMORY

FIELD OF THE INVENTION

The present invention relates to a method for garbage collecting for non-volatile memories. More particularly, the present invention relates to a method for garbage collecting for non-volatile memories used in a Solid State Drive (SSD).

BACKGROUND OF THE INVENTION

For a conventional SSD which is composed of huge amounts of non-volatile memory cells, garbage collection for the non-used non-volatile memory cells is important for the SSD and can improve operation of the SSD. Take a Triple-Level Cell (TLC) SSD for example. The TLC SSD may be composed of several dies. There are several planes in a die. A plane contains thousands of blocks and a block has hundreds of pages. A page may store 4 KB to 8 KB of data and is a basic unit a host can access. The host usually accesses the SSD via a Logical Block Address (LBA). When the operating system of the host sends a command to write a page of data into a specific LBA, it is actually programmed to a corresponding physical page. Due to the mechanism of the SSD, if a data needs to be updated or stored to the same LBA, the new one will not be programed to the same physical page. Instead, an unused or erased page will take the job to program. Data in the original physical page is invalid and waiting for erase for further use. A current mapping between the LBA and the valid physical page is crucial. If the there is something wrong with the mapping, data stored would be lost.

An SSD controller is handling accessing data in the physical page in response to requests to access LBA from the host. If the SSD is new, write speed is fast since there are lots of unused physical pages. After a period of time in use, the write speed becomes slower since there are some blocks needed to be erased to provide unprogrammed physical pages for write commands. Before erasing the used blocks, a problem comes. How to deal with the valid data in the blocks? A practical way to settle this problem is to collect the useful data and move them to a reserved block before erasing. This is also called Garbage Collection (GC). Erased blocks can be further chosen to be reserved blocks. This is often done with wear leveling which ensures no block is over used to reduce its life. However, with the used capacity of the SSD approaching its maximum, GC might be difficult. There are no more physical blocks left for GC and data need to be move very often considering wear leveling. Write speed meets bottleneck. Luckily, SSD manufacturers often have over provisioning (OP) for this situation. OP is extra physical storage capacity which is not seen by the host via LBA but can be used by the SSD controller. Usually, one of 16 cells may be an OP cell.

On the other hand, a mainstream of SSD is using Triple Level Cells (TLC). Comparing with Single Level Cells (SLC), TLC has a prominent benefit of low cost while it has lower access speed and fewer number of times of erase. In order to speed up the access speed of a TLC SSD, there might be a certain amount of SLCs mixed among the TLCs. This feature may be good to enhance performance of the TLC SSD. However, it makes GC complicated for the nature of TLC and SLC, as well as the application of OP. Therefore, an innovative GC method desired, especially a GC method which is workable when worst situation that the SSD is almost full with valid data.

SUMMARY OF THE INVENTION

This paragraph extracts and compiles some features of the present invention; other features will be disclosed in the follow-up paragraphs. It is intended to cover various modifications and similar arrangements included within the spirit and scope of the appended claims.

A goal of the present invention is to provide methods for effectively process garbage collection for a SSD with mixed TLC blocks and SLC block. Therefore, a method for garbage collecting for non-volatile memory, comprising the steps of: a) providing a Solid State Drive (SSD), connected to a host, containing a plurality of Triple Level Cell (TLC) blocks and a plurality of Single Level Cell (SLC) blocks, wherein at least one clean TLC block having no data; b) reading 3M TLC pages in a TLC block having data; c) moving valid data in the TLC blocks to the at least one clean TLC block; d) sending a host program command of 1 page to the host to let host I/O performance smoother and prevent disconnection between the SSD and the host; e) repeating step b) to step d) until valid data in 8 TLC blocks having data are moved; f) reading 1 SLC page in a SLC block having data; g) moving valid data in the SLC block to the at least one clean TLC block; h) sending a host program command of $\alpha$ page to the host to let host I/O performance smoother and prevent disconnection between the SSD and the host; and i) repeating step f) to step h) until valid data in the SLC block having data are moved. M is an integer and $\alpha$ equals to $$\frac{(n+1)}{2^{(n+1)}},$$

where n is a difference between the number of free SLC blocks and a first threshold.

Preferable, M may range from 8 to 24. The method may further comprise a step: j) repeating step b) to step i) until the number of free TLC blocks is greater than a second threshold.

The present invention also provide another method for garbage collecting for non-volatile memory, comprising the steps of: a) providing a SSD, connected to a host, containing a plurality of TLC blocks and a plurality of SLC blocks, wherein at least one clean TLC block having no data; b) reading 3M TLC pages in a TLC block having data; c) moving valid data in the TLC blocks to the at least one clean TLC block; d) sending a host program command of 1 page to the host to let host I/O performance smoother and prevent disconnection between the SSD and the host; and e) repeating step b) to step d) until the number of free TLC blocks is greater than a second threshold. M is an integer and may range from 8 to 24.

The present invention still also provide another method for garbage collecting for non-volatile memory, comprising the steps of: a) providing a SSD, connected to a host, containing a plurality of TLC blocks and a plurality of SLC blocks, wherein at least one clean TLC block having no data; b) reading 1 SLC page in a SLC block having data; c) moving valid data in the SLC block to the at least one clean TLC block; d) sending a host program command of $\alpha$ page to the host to let host I/O performance smoother and prevent disconnection between the SSD and the host; and e) repeating step b) to step d) until the number of free SLC blocks is greater than a third threshold. α equals to $$\frac{(n+1)}{2^{(n+1)}},$$

where n is a difference between the number of free SLC blocks and a first threshold.

The present invention processes garbage collection from TLC source blocks first. After released space is large enough to accommodate valid counts from SLC blocks, one SLC block starts to process garbage collection. The methods are flexible and effective for garbage collection for SSD mixed with both TLC and SLC blocks, especially good for the worst condition that the physical blocks are almost exhausted.

DETAILED DESCRIPTION OF THE PREFERRED EMBODIMENTS

The present invention will now be described more specifically with reference to the following embodiments.

Figure 1:
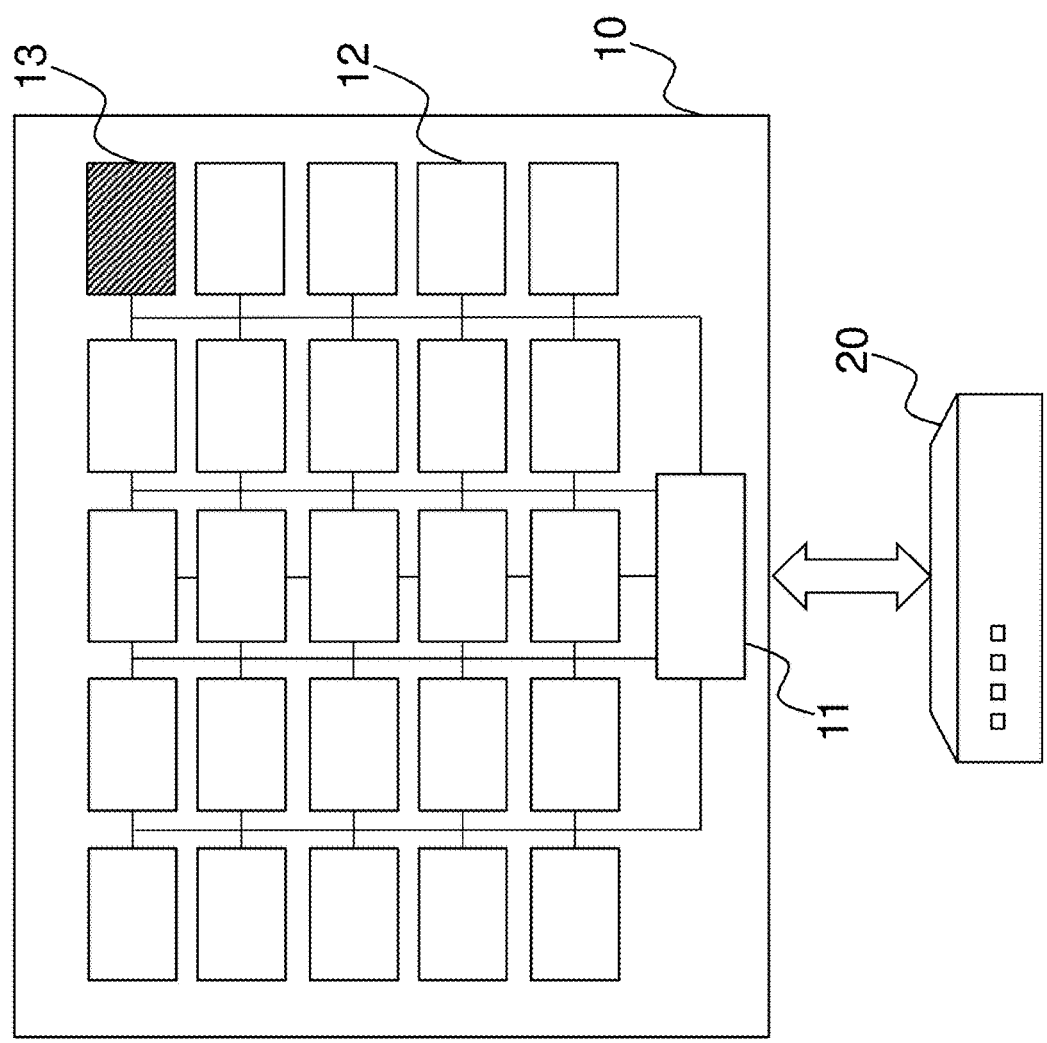
FIG. 1 is a schematic diagram showing an architecture of a SSD and a host used by a method according to the present invention.

Before details of the present invention is described, it needs to understand an architecture which can apply a method the invention provides. Please refer to FIG. 1. It is an architecture of a SSD 10 and a host 20. The SSD 10 and the host 20 are connected so that the host 20 can access data in the SSD 10. The method is for garbage collecting for non-volatile memories. As mentioned above, garbage collecting means the valid data (ready for access) can be moved to other unused or erased block from current location in order to release physical blocks to be erased for further use. Non-volatile memories refer to the physical cells in the SSD 10. For example, it may be a NAND flash cell. In application, the SSD 10 may have many blocks arranged in a plane. There are only 25 blocks shown in FIG. 1. It is for illustration purpose, not to limit the real number of blocks the SSD 10 uses.

The SSD 10 has a controller 11 which may be in charge of data I/O, wear leveling, mapping LBA to physical locations, erasing of blocks, etc. In order to meet the goal of the present invention, the controller 11 is further designed to carry out the processes the method indicates below. The SSD 10 has a feature that it includes TLC blocks 12 (composed of TLCs and marked by a blank frame) and SLC blocks 13 (composed of SLCs and marked by a frame with slashes). Indeed, the SSD 10 is a TLC SSD. Therefore, the number of TLC blocks 12 are much more than the number of SLC blocks 13. Mixed SLC help the SSD 10 run fast and become more stable. One SLC block 13 out of 25 is just an example. It is not to limit the proportion of SLC blocks 13 to TLC blocks 12.

Since the host 20 is the device to read and write the SSD 10, it can have various aspects. The host may be a computer, a smart phone, a server, even a device with an ASIC, having a requirement for data access. The SSD 10 may be a standalone device. It may also be embedded in the host 20.

Figure 2:
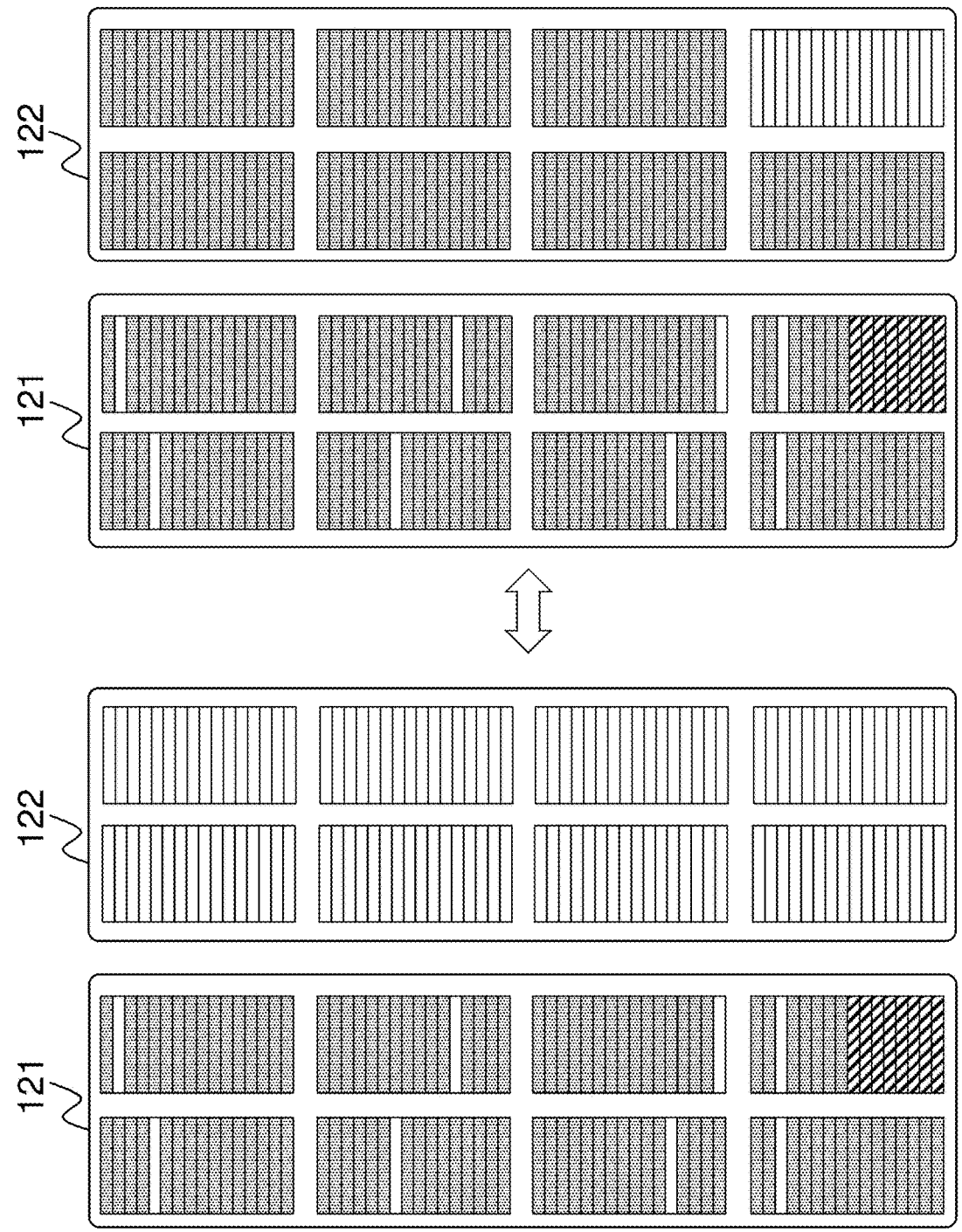
FIG. 2 illustrates data moving between a TLC block with data and a clean TLC.

Please see FIG. 2. It shows two TLC blocks 12 before (left side of the double arrow) and after (right side of the double arrow) the method is applied. There are two TLC blocks: a TLC block 121 with data and a clean TLC block 122. The TLC block 121 has data, however, the data may not be valid. Each grid represents a page. There are 64 pages in a block and the block is enclosed by a frame. Data in the TLC block 121 are marked. The one marked by 'dots' is valid data. Valid data are located in where the corresponding LBA is mapped to. The one marked by 'slashes' is invalid data. The invalid data occupy some pages where data write had been processed before but now are abandoned with no mapping to the LBA. Updated data are stored in other locations where are mapped to some LBA. Meanwhile, there are over provisioned TLC pages among the TLC block 121. The over provisioned TLC pages are blank and contains no data. On the other hand, the clean TLC block 122 are also composed of a number of TLC pages while the TLC pages are 'clean' with no data. The clean TLC block 122 may come from two aspects: they are erased blocks or never been used since the SSD 10 was manufactured. A premise the present invention can be carried out is that there should be at least one block in the SSD 10 which is a clean TLC block 122 having no data. It is better there is a SLC block (not shown) ready for use.

The role of the clean TLC block 122 in the present invention is a target where valid data from one TLC block 121 can be moved to. The TLC block 121 is read to find out valid data and the valid data are written to the clean TLC block 122 sequentially. Invalid data won't be moved as well as the 'null data' in the over provisioned TLC pages. As shown in the right side of FIG. 2, after the method is processed, the TLC block 121 keeps the same while the clean TLC block 122 becomes programed. There are free TLC pages (containing no data) available. The free TLC pages are the results by 'squeezing' space (over provisioned TLC pages and TLC pages with invalid data). The TLC block 121 can be erased to become new clean TLC block 122 and keep colleting valid data until some default condition.

Figure 3:
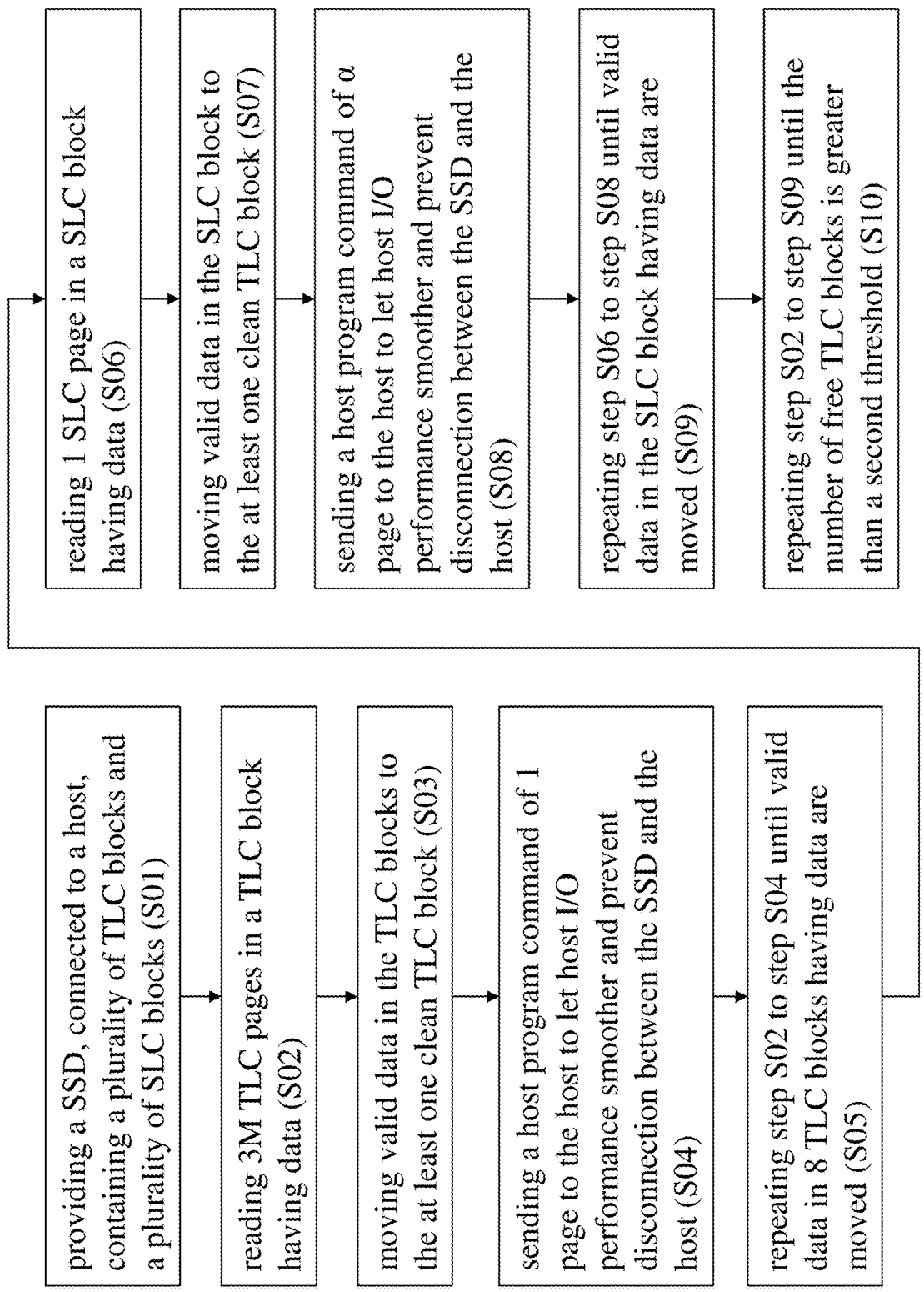
FIG. 3 is a flow chart of a method for garbage collecting for non-volatile memory according to the present invention.

Please see FIG. 3. It is a flow chart of a method for garbage collecting for non-volatile memory according to the present invention. The first step is providing an SSD, connected to a host, containing a plurality of TLC blocks and a plurality of SLC blocks (S01). This step asks an architecture to apply should be what described above. It should be emphasized that there should be at least one clean TLC block having no data in the SSD. Secondly, read 3M TLC pages in a TLC block having data (S02). It means to read the TLC block 121 as mentioned above. However, according to the present invention, it is not to read all TLC pages in a TLC block at once. The read process stops after 3M TLC pages. Here, M is an integer. Preferably, M may range from 8 to 24. It means 24 to 72 TLC pages are read before next step is carried on. Limitation of the step S02 is to create time to response to host program in case the host 20 may think it is disconnected with the SSD 10. In practice, M can be chosen as 16.

Next, move valid data in the TLC blocks to the at least one clean TLC block (S03). The result can be seen in FIG. 2 and it is not repeated again. A fourth step is sending a host program command of 1 page to the host to let host I/O performance smoother and prevent disconnection between the SSD and the host (S04). This is the means to let host I/O performance smoother and prevent disconnection. To now, a portion of valid data are moved to the clean TLC page, but garbage collection for the TLC block has not finished yet. Thus, a fifth step is repeating step S02 to step S04 until valid data in 8 TLC blocks having data are moved (S05).

Consider an ideally worst condition, except one clean TLC block, other TLC block are all stored with valid data. The host 20 and the SSD 10 may record the same amount data not matter it is logical or physical. After 8 TLC blocks are processed from step S02 to step S04, the newly increased free block (denoted as new block no matter it is TLC or SLC) could be:

new block=½ TLC block−½ SLC block          equation 1

−½ SLC block means half of a SLC block in the SSD are used for the reason of data moving. Now, SLC block increases useless data and free TLC are available. It is time to process garbage collecting on SLC block.

The next step is reading 1 SLC page in a SLC block having data (S06). The targeted SLC block may look like the SLC block 121 in FIG. 2 but with difference storage capacity (one TLC cell records 3 bits but one SLC cell records 1 bit). Then, moving valid data in the SLC block to the at least one clean TLC block (S07). This step is similar to step S03 and move data to the one clean TLC block. A key step for SLC block is sending a host program command of α page to the host to let host I/O performance smoother and prevent disconnection between the SSD and the host (S08). Step S08 does similar thing as the step S04. However, the host program command may not be a complete page. Here, α equals to $$\frac{(n+1)}{2^{(n+1)}},$$

where n is a difference between the number of free SLC blocks and a first threshold. The first threshold could be any assigned value, for example, 20. Once there are 22 free SLC blocks, n equals 2. For the SLC block to garbage collected, it needs to repeat step S06 to step S08 until valid data in the SLC block having data are moved (S09).

Consider another ideally worst condition, the SLC block is fully stored with valid data. After the SLC block are processes from step S06 to step S08, the newly increased free block could be:

new block=−⅓ TLC block+(1−α)SLC block          equation 2

Since one TLC can store 3 times as a SLC does, −⅓ TLC block means one third of free TLC blocks are further occupied by the valid data from the SLC block. −α SLC block in the SSD are used also for the reason of data moving.

The method in the present invention is to carry garbage collection with 8 TLC blocks and 1 SLC block alternately. Thus, after one run of 8 TLC blocks and 1 SLC block, new free block could be at least:

new block=⅙ TLC block+(½−α)SLC block          equation 3

Equation 3 is obtained by combining equation 1 and equation 2. The new free block could be more if there are more invalid data in the blocks before garbage collecting.

The method should be terminated. It is defined by the last step: repeating step S02 to step S09 until the number of free TLC blocks is greater than a second threshold (S10). An SSD may be set to have 50 free TLC blocks for further use after the processes are carried out. '50' is the second threshold. Second threshold is determined according to the use of SSD. If the SSD are often written data, the second threshold should be set larger and the time to execute the present method should be as early the free TLC blocks become exhausted as possible.

Figure 4:
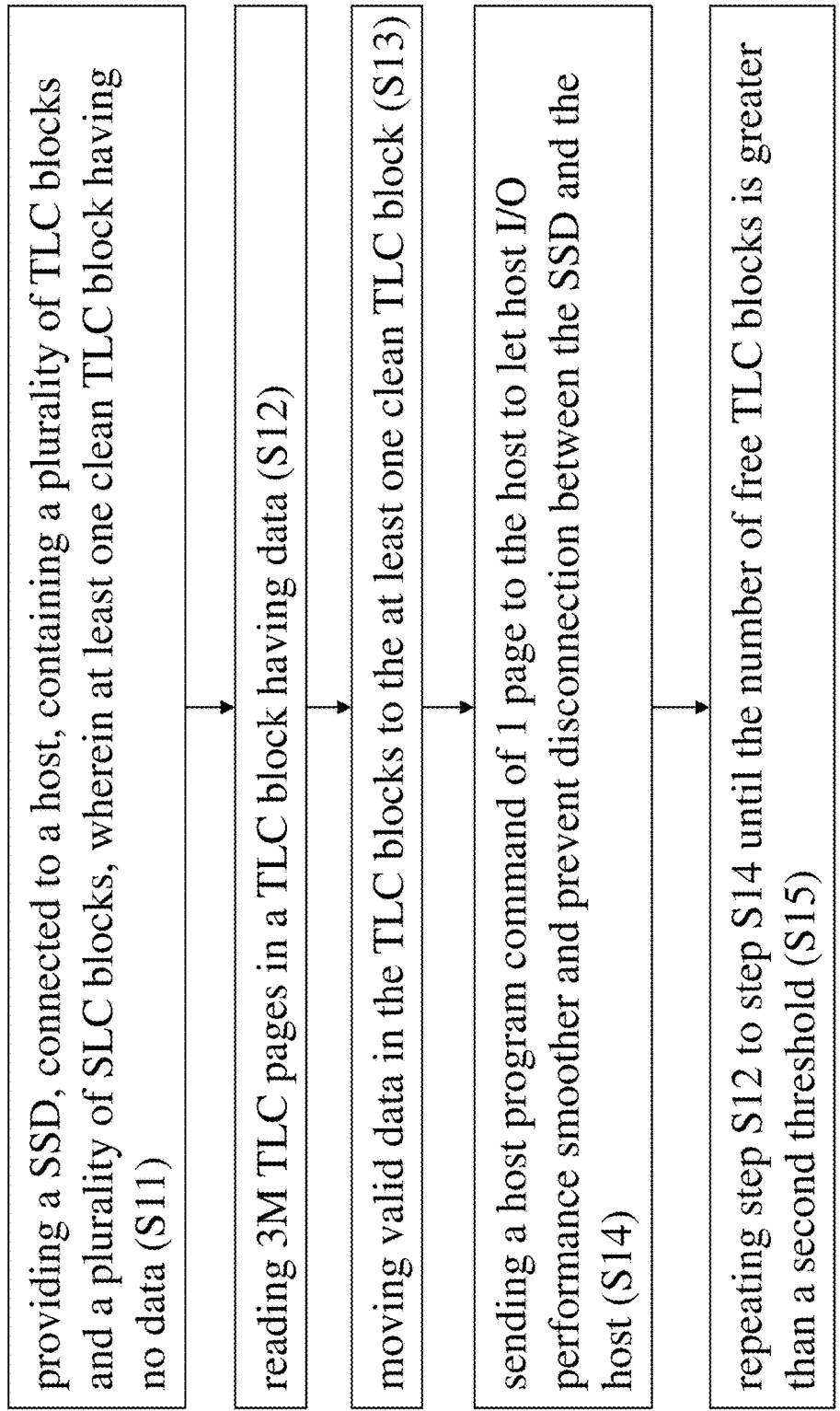
FIG. 4 is a flow chart of another method for garbage collecting for non-volatile memory according to the present invention.

The previous embodiment is to process garbage collection for both TLC and SLC blocks. In fact, the present invention can focus only on TLC blocks. Please see FIG. 4. It is a flow chart of another method for garbage collecting for non-volatile memory according to the present invention. The first step is providing an SSD, connected to a host, containing a plurality of TLC blocks and a plurality of SLC blocks, wherein at least one clean TLC block having no data (S11). It is also applicable to the architecture in FIG. 1. Then, read 3M TLC pages in a TLC block having data (S12), move valid data in the TLC blocks to the at least one clean TLC block (S13) and send a host program command of 1 page to the host to let host I/O performance smoother and prevent disconnection between the SSD and the host (S14). Steps S12 to S14 are the same as what are described in the step S02 to S04 in the previous embodiment. M is an integer and can ranges from 8 to 24. It is not repeated to give more illustration on it. Different from the previous embodiment, the current method only focuses on TLC block (although some SLC block would be used for data moving). Thus, a last step of the present method is repeating step S12 to step S14 until the number of free TLC blocks is greater than a second threshold (S15). The second threshold has the same definition as the previous embodiment.

Figure 5:
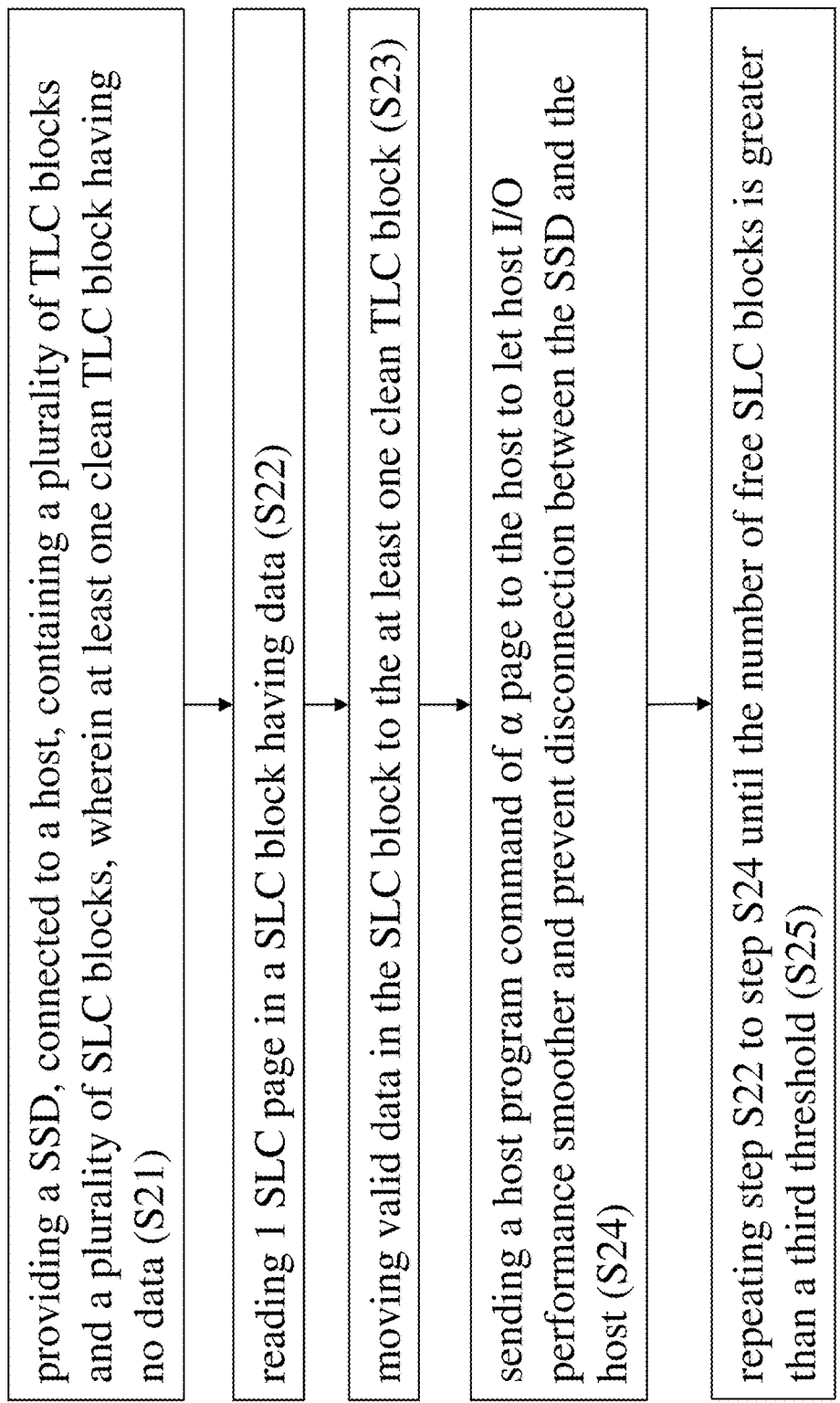
FIG. 5 is a flow chart of still another method for garbage collecting for non-volatile memory according to the present invention.

Similarly, the present invention can focus only on SLC blocks while the target of data moving is TLC blocks. Please see FIG. 5. It is a flow chart of still another method for garbage collecting for non-volatile memory according to the present invention. providing an SSD, connected to a host, containing a plurality of TLC blocks and a plurality of SLC blocks (S21). Of course, there should be at least one clean TLC block having no data. Then, read 1 SLC page in a SLC block having data (S22), move valid data in the SLC block to the at least one clean TLC block (S23) and send a host program command of α page to the host to let host I/O performance smoother and prevent disconnection between the SSD and the host (S24). Step S22 to step S24 are corresponding to step S06 to step S08. It is a standard operation for the SLC blocks to process garbage collection. However, garbage collection is not finished for the SLC blocks. Therefore, a last and stopping step is repeating step S22 to step S24 until the number of free SLC blocks is greater than a third threshold (S25). Similar to the second threshold, the third threshold is set for free SLC blocks which will be available after all the processes are finished. In step S24, α equals to $$\frac{(n+1)}{2^{(n+1)}},$$

where n is a difference between the number of free SLC blocks and a first threshold. n and the first threshold are the same as what defined in the first embodiment. It is not repeated again.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A method for garbage collecting for non-volatile memory, comprising the steps of:
    a) providing a Solid State Drive (SSD), connected to a host, containing a plurality of Triple Level Cell (TLC) blocks and a plurality of Single Level Cell (SLC) blocks, wherein at least one clean TLC block having no data;
    b) reading 3M TLC pages in a TLC block having data;
    c) moving valid data read from the 3M TLC pages in the TLC block in step b) to the at least one clean TLC block;
    d) sending a host program command of 1 page to the host;
    e) repeating step b) to step d) until valid data in each of the TLC page in 8 TLC blocks having data are moved;
    f) reading 1 SLC page in a SLC block having data;
    g) moving valid data read from the 1 SLC page in the SLC block in step f) to the at least one clean TLC block;
    h) sending a host program command of α page to the host; and
    i) repeating step f) to step h) until valid data in each of the SLC page in the SLC block having data are moved;
    wherein M is an integer and α equals to $$\frac{(n+1)}{2(n+1)},$$

where n is a difference between the number of free SLC blocks and a first threshold.

2. The method according to claim 1, wherein M ranges from 8 to 24.

3. The method according to claim 1, further comprising a step: j) repeating step b) to step i) until the number of free TLC blocks is greater than a second threshold.

4. A method for garbage collecting for non-volatile memory, comprising the steps of:
    a) providing an SSD, connected to a host, containing a plurality of TLC blocks and a plurality of SLC blocks, wherein at least one clean TLC block having no data;
    b) reading 3M TLC pages in a TLC block having data;
    c) moving valid data read from the 3M TLC pages in the TLC block in step b) to the at least one clean TLC block;
    d) sending a host program command of 1 page to the host; and
    e) repeating step b) to step d) until the number of free TLC blocks is greater than a threshold;
    wherein M is an integer.

5. The method according to claim 4, wherein M ranges from 8 to 24.

6. A method for garbage collecting for non-volatile memory, comprising the steps of:
    a) providing an SSD, connected to a host, containing a plurality of TLC blocks and a plurality of SLC blocks, wherein at least one clean TLC block having no data;
    b) reading 1 SLC page in a SLC block having data;
    c) moving valid data read from the 1 SLC page in the SLC block in step b) to the at least one clean TLC block;
    d) sending a host program command of α page to the host; and
    e) repeating step b) to step d) until the number of free SLC blocks is greater than a second threshold;
    wherein α equals to $$\frac{(n+1)}{2(n+1)},$$

where n is a difference between the number of free SLC blocks and a first threshold.

* * * * *